United States Patent
Lin et al.

(10) Patent No.: US 10,491,227 B1
(45) Date of Patent: Nov. 26, 2019

(54) INJECTION LOCKED FREQUENCY DIVIDER

(71) Applicant: NATIONAL CHI NAN UNIVERSITY, Nantou (TW)

(72) Inventors: Yo-Sheng Lin, Nantou (TW); Kai-Siang Lan, Nantou (TW)

(73) Assignee: NATIONAL CHI NAN UNIVERSITY, Nantou (TW)

(*) Notice: Subject to any disclaimer, the term of this patent is extended or adjusted under 35 U.S.C. 154(b) by 0 days.

(21) Appl. No.: 16/126,893

(22) Filed: Sep. 10, 2018

(30) Foreign Application Priority Data

May 21, 2018 (TW) .............................. 107117177 A

(51) Int. Cl.
| | |
|---|---|
| H03D 3/24 | (2006.01) |
| H03L 7/181 | (2006.01) |
| H03L 7/185 | (2006.01) |
| H03L 7/193 | (2006.01) |
| H03D 7/14 | (2006.01) |
| H03H 11/32 | (2006.01) |

(52) U.S. Cl.
CPC ............ H03L 7/181 (2013.01); H03D 7/1458 (2013.01); H03L 7/185 (2013.01); H03L 7/193 (2013.01); *H03H 11/32* (2013.01)

(58) Field of Classification Search
CPC ... H04L 3/033; H04L 7/0337; H03L 2207/06; H03L 2207/08; H03L 2207/18; H03L 2207/50; H03B 2200/0074; H03B 5/1212

USPC ........ 375/373, 371, 375; 455/103, 127, 307; 331/115, 117; 327/118
See application file for complete search history.

(56) References Cited

U.S. PATENT DOCUMENTS

| | | | | |
|---|---|---|---|---|
| 6,911,870 B2* | 6/2005 | Gierkink | ................ | H03B 27/00 331/117 FE |
| 7,446,617 B2* | 11/2008 | Jang | ........................ | H03B 19/14 331/117 FE |
| 7,522,007 B2* | 4/2009 | Jang | ........................ | H03B 19/14 327/118 |

* cited by examiner

*Primary Examiner* — Khai Tran
(74) *Attorney, Agent, or Firm* — Womble Bond Dickinson (US) LLP

(57) ABSTRACT

A frequency divider includes a signal injection circuit and an oscillating circuit. The signal injection circuit includes a transistor of which a gate receives an input signal with an input frequency, a drain and a source cooperatively provide a first differential signal pair, and a body receives a biasing voltage. The two circuits cooperate to form a tank circuit having a free-running frequency and defining a frequency locking range which is around N times the free-running frequency and within which the input frequency falls. The tank circuit generates a second differential signal pair that is related to the first differential signal pair and that has an oscillating frequency which is one-$N^{th}$ the input frequency.

8 Claims, 4 Drawing Sheets

INJECTION LOCKED FREQUENCY DIVIDER

CROSS-REFERENCE TO RELATED APPLICATION

This application claims priority of Taiwanese Invention Patent Application No. 107117177, filed on May 21, 2018.

FIELD

The disclosure relates to a frequency divider, and more particularly to an injection locked frequency divider (ILFD).

BACKGROUND

Referring to FIG. 1, a conventional ILFD includes a signal injection circuit 11, an oscillating circuit 12, and two buffer circuits 13, 14. The signal injection circuit 11 receives an input voltage signal (Vin). The oscillating circuit 12 performs frequency division on the input voltage signal (Vin) to generate a differential oscillating signal pair, which has a frequency being one-$N^{th}$ a frequency of the input voltage signal (Vin), where N is a positive integer greater than or equal to two. The buffer circuits 13, 14 cooperatively perform buffering on the differential oscillating signal pair to generate a differential output signal pair (vo1, vo2).

However, the conventional ILFD has a narrow frequency locking range, so in a case that the frequency lock range deviates because of variation in process or temperature, the frequency of the input voltage signal (Vin) may fall outside the deviated frequency locking range. As a result, the conventional ILFD may fail to perform frequency division on the input voltage signal (Vin).

SUMMARY

Therefore, an object of the disclosure is to provide an injection locked frequency divider that may have a relatively wide frequency locking range.

According to the disclosure, the injection locked frequency divider includes a signal injection circuit and an oscillating circuit. The signal injection circuit includes an injection transistor and a resistor. The injection transistor has a gate terminal disposed to receive an input voltage signal having an input frequency, a drain terminal, a source terminal that cooperates with the drain terminal to provide a first differential signal pair, and a body terminal. The resistor couples the body terminal of the injection transistor to a biasing voltage source, and configured to make a voltage at the body terminal of the injection transistor higher than a voltage at the source terminal of the injection transistor. The oscillating circuit is coupled to the signal injection circuit, and is configured to cooperate with the signal injection circuit to form a tank circuit that has a free-running frequency and that defines a frequency locking range around N times the free-running frequency of the tank circuit, such that the input frequency falls within the frequency locking range, where N is a positive integer not smaller than two. The tank circuit generate a second differential signal pair that is related to the first differential signal pair and that has an oscillating frequency one-$N^{th}$ the input frequency.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
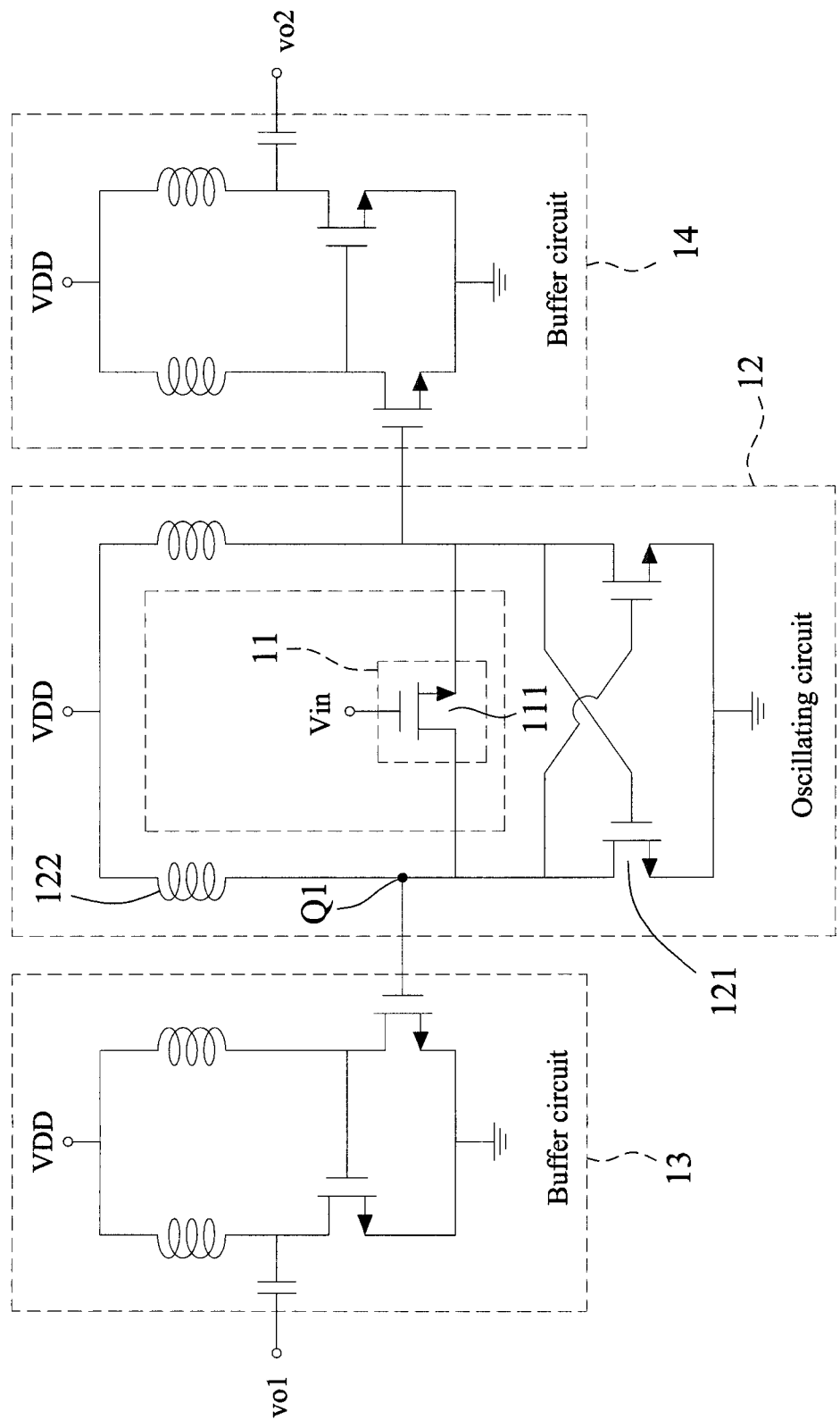
FIG. 1 is a schematic circuit diagram illustrating a conventional ILFD.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
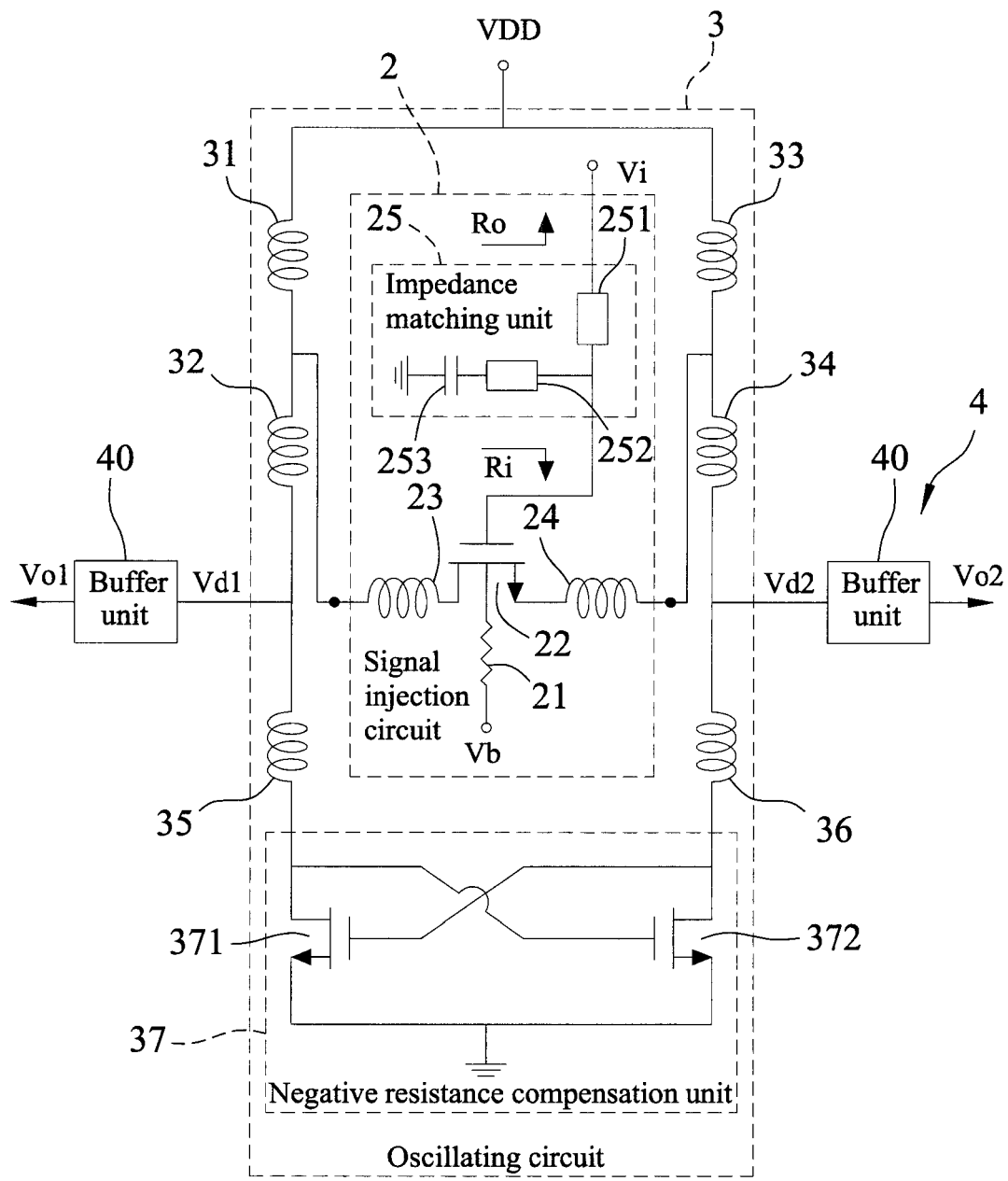
FIG. 2 is a schematic circuit diagram illustrating an embodiment of an ILFD according to this disclosure.
Figure 3:
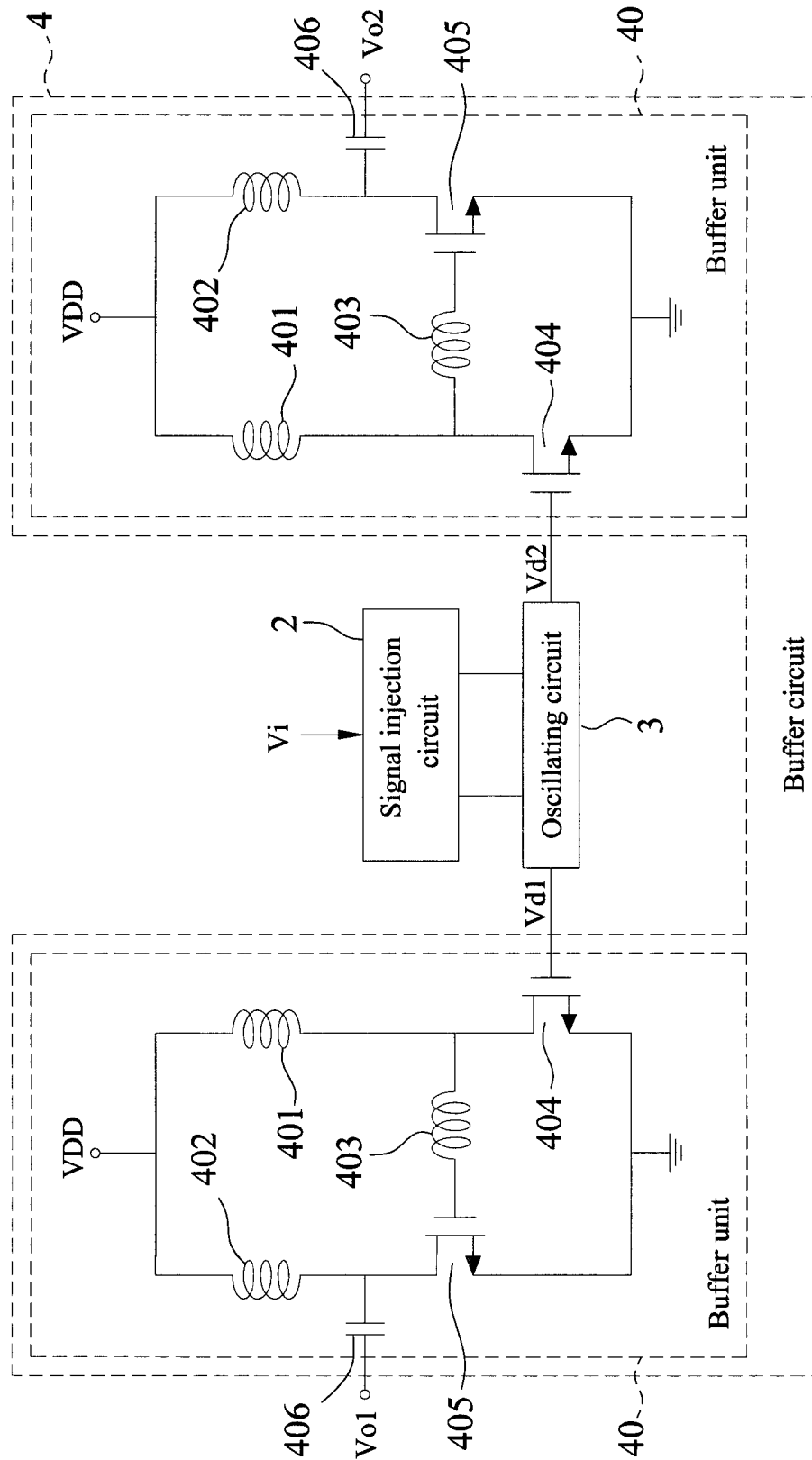
FIG. 3 is a schematic circuit diagram illustrating a buffer circuit of the embodiment.

Referring to FIGS. 2 and 3, the embodiment of the ILFD according to this disclosure is a divide-by-N ILFD, and includes a signal injection circuit 2, an oscillating circuit 3 and a buffer circuit 4, where N is a positive integer greater than or equal to two.

The signal injection circuit 2 includes a resistor 21, an injection transistor 22, two inductors 23, 24 and an impedance matching unit 25.

The resistor 21 has a first terminal, and a second terminal receiving a biasing voltage (Vb) from a biasing voltage source (not shown).

The injection transistor 22 is, for example, an N-type metal-oxide-semiconductor field-effect transistor (MOSFET) that has a gate terminal receiving an input voltage signal (Vi), a drain terminal, a source terminal, and a body terminal coupled to the first terminal of the resistor 21, and is configured to provide a first differential signal pair at the drain and source terminals thereof. The biasing voltage (Vb) is configured to be higher than a voltage at the source terminal of the injection transistor 22, and makes a voltage at the body terminal of the injection transistor 22 higher than that at the source terminal of the injection transistor 22.

The inductor 23 has a first terminal coupled to the drain terminal of the injection transistor 22, and a second terminal coupled to the oscillating circuit 3. The inductor 24 has a first terminal coupled to the source terminal of the injection transistor 22, and a second terminal coupled to the oscillating circuit 3.

The impedance matching unit 25 couples the gate terminal of the injection transistor 22 to an input signal source (not shown) that provides the input voltage signal (Vi) having an input frequency, and is configured for impedance matching between an output impedance (Ro) of the input signal source and an input impedance (Ri) seen into the gate terminal of the injection transistor 22, so as to achieve efficient power transmission when the input voltage signal (Vi) is transferred from the input signal source to the injection transistor 22. In this embodiment, the impedance matching unit 25 includes two inductors 251, 252 and a capacitor 253. In this embodiment, the inductors 251, 252 are transmission line inductors, but this disclosure is not limited in this respect.

The inductor 251 has a first terminal coupled to the input signal source for receiving the input voltage signal (Vi) therefrom, and a second terminal coupled to the gate terminal of the injection transistor 22. The inductor 252 has a first terminal coupled to the second terminal of the inductor 251, and a second terminal. The capacitor 253 couples the second terminal of the inductor 252 to ground.

The oscillating circuit 3 is coupled to the inductors 23, 24 of the signal injection circuit 2, and is configured to cooperate with the signal injection circuit 2 to form a tank circuit that has a free-running frequency and that defines a frequency locking range of the ILFD which is around N times the free-running frequency of the tank circuit, such that the input frequency falls within the frequency locking range. The tank circuit generates a second differential signal pair that includes a pair of oscillating signals (Vd1, Vd2) complementary to each other, that is related to the first differential signal pair, and that has an oscillating frequency which is one-$N^{th}$ the input frequency. The oscillating circuit 3 includes inductors 31-36, and a negative resistance compensation unit 37.

The inductor 31 has a first terminal to be coupled to a power source (VDD), and a second terminal coupled to the second terminal of the inductor 23 of the signal injection circuit 2. The inductor 32 has a first terminal coupled to the second terminal of the inductor 31, and a second terminal. The inductor 33 has a first terminal coupled to the first terminal of the inductor 31, and a second terminal coupled to the second terminal of the inductor 22 of the signal injection circuit 2. The second terminals of the inductors 31, 33 cooperatively receive the first differential signal pair from the injection transistor 22 via the inductors 23, 24. The inductor 34 has a first terminal coupled to the second terminal of the inductor 33, and a second terminal cooperating with the second terminal of the inductor 32 to output the second differential signal pair (Vd1, Vd2). The inductor 35 has a first terminal coupled to the second terminal of the inductor 32, and a second terminal. The inductor 36 has a first terminal coupled to the second terminal of the inductor 34, and a second terminal. The negative resistance compensation unit 37 is coupled to the second terminals of the inductors 35, 36, and is configured to have an equivalent negative resistance to cancel a parasitic resistance of the tank circuit formed by the signal injection circuit 2 and the oscillating circuit 3. In this embodiment, the negative resistance compensation unit 37 includes transistors 371, 372.

The transistor 371 has a first terminal coupled to the second terminal of the inductor 35, a grounded second terminal, and a control terminal coupled to the second terminal of the inductor 36. The transistor 372 has a first terminal coupled to the second terminal of the inductor 36, a grounded second terminal, and a control terminal coupled to the second terminal of the inductor 35.

The buffer circuit 4 is coupled to the second terminals of the inductors 32, 34 of the oscillating circuit 3 for receiving the second differential signal pair (Vd1, Vd2) therefrom, and is configured to perform buffering on the second differential signal pair (Vd1, Vd2) to generate a differential output signal pair that includes a pair of output signals (Vo1, Vo2) that are complementary to each other. In this embodiment, the buffer circuit 4 includes two buffer units 40 that have identical structure and that are used to perform buffering on the oscillating signals (Vd1, Vd2), respectively, but this disclosure is not limited in this respect.

In this embodiment, each of the buffer units 40 includes inductors 401, 402, 403, transistors 404, 405, and a capacitor 406.

The inductor 401 has a first terminal disposed to be coupled to the power source (VDD), and a second terminal. The transistor 404 has a first terminal coupled to the second terminal of the inductor 401, a grounded second terminal, and a control terminal coupled to the second terminal of a corresponding one of the inductors 32, 34 of the oscillating circuit 3 for receiving a corresponding one of the oscillating signals (Vd1, Vd2) therefrom. The inductor 402 has a first terminal coupled to the first terminal of the inductor 401, and a second terminal. The transistor 405 has a first terminal coupled to the second terminal of the inductor 402, a grounded second terminal, and a control terminal. The inductor 403 is coupled between the first terminal of the transistor 404 and the control terminal of the transistor 405. The capacitor 406 has a first terminal coupled to the first terminal of the transistor 405, and a second terminal outputting a corresponding one of the output signals (Vo1, Vo2).

Each of the buffer units 40 has a conversion gain, which can be derived according to:

$$CG = \frac{CGo}{1 - \omega^2 \cdot L_{403} \cdot C_{gs405}} \tag{1}$$

where CG represents the conversion gain of the buffer unit 40, $CG_o$ represents a conversion gain of the buffer unit 40 with the inductor 403 omitted, $\omega$ represents an angular frequency of the corresponding one of the oscillating signal (Vd1, Vd2), $L_{403}$ represents an inductance value of the inductor 403, and $C_{gs405}$ represents a capacitance value of gate-source capacitance of the transistor 405.

According to equation (1), it is known that use of the inductor 403 can increase the conversion gain. For example, when $\omega^2 \cdot L_{403} \cdot C_{gs405}$ equals 0.75, the conversion gain (CG) would become four times the conversion gain (CGo).

In this embodiment, each of the transistors 371, 372, 404, 405 is, for example, an N-type MOSFET having a drain terminal, a source terminal, and a gate terminal serving as the first, second and control terminals thereof, but this disclosure is not limited in this respect.

The inductors 31-36 cooperate with parasitic capacitance (e.g., gate-drain capacitance, gate-source capacitance, drain-source capacitance) of the transistors 22, 371, 372, 404 to form the tank circuit which is a parallel LC circuit having the free-running frequency. The negative resistance compensation circuit 37 provides an equivalent negative resistance to cancel a parasitic resistance of the tank circuit, so as to maintain stable oscillation. The ILFD of this embodiment is exemplified by a divide-by-two ILFD (i.e., N=2), so when the input frequency is approximately two times the free-running frequency, the ILFD would be in a locked state, where the frequency of the second differential signal pair (Vd1, Vd2) has a frequency that is half the input frequency. It is noted that N may be greater than two in other embodiments with appropriate design of the parasitic capacitance of the transistors 22, 371, 372, 404 and the inductance of the inductors 31-36 in consideration of the desired input frequency.

In general, the ILFD has a frequency lock range where the ILFD can perform frequency division on the input voltage signal (Vi) normally or as intended. For instance, when the free-running frequency is 78 GHz, the frequency locking range may be, for example, between 146 GHz and 166 GHz. In such a case, when the input frequency of the input voltage signal (Vi) is smaller than 146 GHz or greater than 166 GHz, the ILFD may not normally perform frequency division on the input voltage signal (Vi), so the second differential signal pair may not be successfully output as desired; when the input frequency of the input voltage signal (Vi) falls within the frequency locking range, such as being 156 GHz, 166 GHz, or 152 GHz, the frequency of the second differential signal pair output by the oscillating circuit 3 would be locked to half the input frequency (e.g., 78 GHz, 83 GHz, or 76 GHz for the corresponding example).

It is noted that the ILFD of this embodiment is a differential circuit, so half circuit analysis is suitable to be applied in theory. In the half circuit analysis, the tank circuit includes parasitic capacitance of $C1=C_{gd}+C_{ds}/2$ at the second terminal of the inductor 31, parasitic capacitance of $C2=C_{gs}+C_{ds}/2$ at the second terminal of the inductor 33, parasitic capacitance of $C_{gs404}$ at the second terminal of the inductors 32, 34, parasitic capacitance of $C3=C_{ds371}+C_{gs372}$ at the second terminal of the inductor 35, and parasitic capacitance of $C4=C_{ds372}+C_{gs371}$ at the second terminal of the inductor 36, where $C_{gd}$, $C_{gs}$ and $C_{ds}$ represent the gate-drain capacitance, the gate-source capacitance and the drain-source capacitance of the injection transistor 22, respectively; $C_{ds371}$ and $C_{gs371}$ represent the drain-source capacitance and the gate-source capacitance of the transistor 371, respectively; $C_{ds372}$ and $C_{gs372}$ represent the drain-source capacitance and the gate-source capacitance of the transistor 372, respectively; and $C_{gs404}$ represents the gate-source capacitance of the transistor 404 of each of the buffer units 40. The frequency locking range of this embodiment may thus be derived by:

$$LR = \frac{4\pi fo}{Q} \cdot \frac{I_i}{\sqrt{I_o^2 - I_i^2}} \quad (2)$$

$$fo = \frac{1}{2\pi\sqrt{Lp \cdot Cp}} \quad (3)$$

$$I_i = \frac{I_n}{1 - \omega^2 \cdot L_i \cdot C_{dp}} \quad (4)$$

where LR represents a width of the frequency locking range of this embodiment; Q is a quality factor of the ILFD of this embodiment; fo represents the free-running frequency of the tank circuit; $I_o$ represents a drain current of the transistor 371 (or 372); $I_i$ represents a drain current of the injection transistor 22; Lp represents equivalent inductance provided by parallel connection of the inductors 31, 32, 35 (or 33, 34, 36); Cp represents equivalent capacitance provided by parallel connection of the parasitic capacitances C1, $C_{gs404}$ (at the second terminal of the inductor 32), C3 (at the second terminal of the inductor 35) or provided by parallel connection of the parasitic capacitances C2, $C_{gs404}$, C4; $I_n$ represents a drain current of the injection transistor 22 in the case that the inductors 23, 24 are omitted; $\omega$ represents an angular frequency of the second differential signal pair (Vd1, Vd2); $L_i$ represents inductance of the inductor 23 (or 24); and $C_{dp}$ represents parasitic capacitance at the drain or source terminal of the injection transistor 22.

According to equation (2), it is known that increase of the free-running frequency (fo) or the drain current ($I_i$) of the injection current may make the frequency locking range wider. This embodiment uses the inductors 31-36 to increase the free-running frequency (fo) (according to equation (3)), and uses the inductors 23, 24 to cause $I_i$ to be greater than $I_n$ (according to equation (4)). Furthermore, by virtue of the forward body bias technique that is applied to the injection transistor 22 and that makes the voltage at the body terminal of the injection transistor 22 higher than that at the source terminal of the injection transistor 22, a threshold voltage of the injection transistor 22 may be reduced, so that $I_n$ increases, resulting in larger $I_i$ and thus a wider frequency locking range.

Referring to FIG. 1 again, the frequency locking range of the conventional ILFD depicted in FIG. 1 may be derived by:

$$lr = \frac{4\pi fo1}{Q1} \cdot \frac{I_N}{\sqrt{I_{o1}^2 - I_N^2}} \quad (5)$$

$$fo1 = \frac{1}{2\pi\sqrt{L_{122} \cdot C_{Q1}}} \quad (6)$$

where lr represents a width of the frequency locking range of the conventional ILFD; Q1 is a quality factor of the conventional ILFD; fo1 represents the free-running frequency of the tank circuit of the conventional ILFD; $I_{o1}$ represents a drain current of a transistor 121 of the conventional ILFD; $I_N$ represents a drain current of a transistor 111 of the conventional ILFD; $L_{122}$ represents inductance of an inductors 122 of the conventional ILFD; and $C_{Q1}$ represents a total parasitic capacitances at node Q1 of the conventional ILFD.

To make a fair comparison between the ILFR of this embodiment and the conventional ILFR, it is assumed that total inductance and total parasitic capacitance of the tank circuit of this embodiment are the same as those of the tank circuit of the conventional ILFR. Accordingly, the inductance of each of the inductors 31-36 is assumed to be L122/3, and each of the parasitic capacitances C1, C2, C3, C4 is $C_{Q1}/2$, while the gate-source capacitance $C_{gs404}$ of the transistor 404 of each buffer unit 40 is omitted because it is much smaller than each of the parasitic capacitances C1, C2, C3, C4. Based on such assumption, it can be acquired from equation (3) that $$fo = \frac{\sqrt{9 - 3 \cdot \sqrt{5}}}{2\pi\sqrt{L_{122} \cdot C_{Q1}}},$$

and fo1 being $$\frac{1}{2\pi\sqrt{L_{122} \cdot C_{Q1}}}$$

is smaller than fo. Furthermore, because of the forward body bias technique that is applied to the injection transistor 22, the threshold voltage of the injection transistor 22 would be smaller than that of the transistor 111 of the conventional ILFD, so $I_N$ (see equation (5)) would be smaller than $I_n$, which is smaller than $I_i$ (see equation (4)). As a result, it is derived that the ILFD of this embodiment would have a wider frequency locking range than the conventional ILFD.

Figure 4:
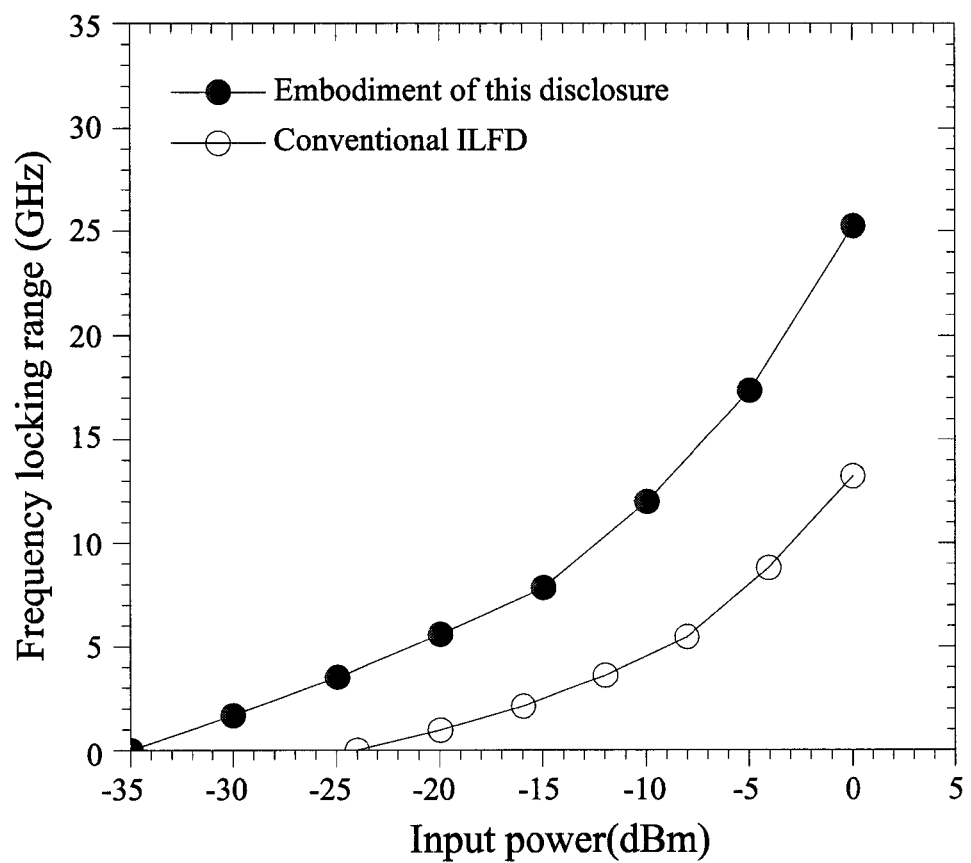
FIG. 4 is a plot showing a simulation result of a comparison between frequency locking ranges of the embodiment and the conventional ILFD under different input power.

FIG. 4 is a plot that shows a simulation result regarding a comparison between the widths of the frequency locking ranges of the embodiment (see FIGS. 2 and 3) and the conventional ILFD (see FIG. 1) under different input power, where the input power refers to power of the signal inputted to the ILFD, such as the input voltage signal (Vin) for the conventional ILFD and the input voltage signal (Vi) for the embodiment. The width of the frequency locking range of the ILFD herein is defined as the width of the frequency locking range corresponding to input power of 0 dBm. As shown in FIG. 4, for the input voltage signal (Vi) having input power of 0 dBm, the frequency locking range of the ILFD of the embodiment has a width of 25 GHz and the frequency locking range of the conventional ILFD has a width of 13.1 GHz. In other words, the frequency locking range of the ILFD of this embodiment is wider than that of the conventional ILFD. Additionally, sensitivity of the ILFD is correlated to minimum input power required for the ILFD to normally perform the frequency division (i.e., frequency division by two in this embodiment). The smaller the minimum input power level required for an ILFD, the better the sensitivity of the ILFD. As can be seen in FIG. 4, the minimum input power required for the ILFD of the embodiment is −35 dBm, whereas the minimum input power required for the conventional ILFD is −24 dBm. That is to say, the ILFD of the embodiment has better sensitivity as compared to the conventional ILFD.

In practice, the embodiment of the ILFD according to this disclosure can also serve as a divide-by-four ILFD (i.e., N=4). Because of the non-linearity of the transistors 371, 372, signals provided at the nodes where the oscillating signals (Vd1, Vd2) are provided may also include differential signal components of which the frequency is triple the free-running frequency of the tank circuit and which are weaker in signal strength than the oscillating signals (Vd1, Vd2). Accordingly, when the input frequency of the input voltage signal (Vi) is around four times the free-running frequency of the tank circuit, the mixing of the input voltage signal and the aforesaid differential signal components would generate the differential output signal pair with a frequency that is one-fourth the input frequency.

In sum, by virtue of the inductors 23, 24 and/or the forward body bias technique that makes the voltage at the body terminal of the transistor 22 greater than the voltage at the source terminal of the transistor 22, the drain current $I_i$ of the transistor 22 may be increased, thereby resulting in a wider frequency locking range. The inductors 31-36 may contribute to increase of the free-running frequency, which may also cause a wider frequency locking range. Further, the impedance matching unit 25 may lead to lower input power required for the ILFD to normally perform frequency division, achieving relatively good sensitivity. The inductor 403 may promote the conversion gain of the corresponding buffer unit 40.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An injection locked frequency divider, comprising:
   a signal injection circuit including
      an injection transistor having a gate terminal that is disposed to receive an input voltage signal having an input frequency, a drain terminal, a source terminal that cooperates with said drain terminal to provide a first differential signal pair, and a body terminal, and
      a resistor coupling said body terminal of said injection transistor to a biasing voltage source, and configured to make a voltage at said body terminal of said injection transistor higher than a voltage at said source terminal of said injection transistor; and
   an oscillating circuit coupled to said signal injection circuit, and configured to cooperate with said signal injection circuit to define a free-running frequency and a frequency locking range which is around N times the free-running frequency, such that the input frequency falls within the frequency locking range, where N is a positive integer not smaller than two;
   wherein said oscillating circuit cooperates with said signal injection circuit to generate a second differential signal pair that is related to the first differential signal pair and that has an oscillating frequency which is one-$N^{th}$ the input frequency.

2. The injection locked frequency divider of claim 1, wherein said signal injection circuit further includes a first inductor having a first terminal coupled to said drain terminal of said injection transistor, and a second terminal coupled to said oscillating circuit, and a second inductor having a first terminal coupled to said source terminal of said injection transistor, and a second terminal coupled to said oscillating circuit.

3. The injection locked frequency divider of claim 2, wherein said signal injection circuit further includes an impedance matching unit to couple said gate terminal of said injection transistor to an input signal source that provides the input voltage signal, and configured for impedance matching between an output impedance of the input signal source and an input impedance seen into said gate terminal of said injection transistor.

4. The injection locked frequency divider of claim 3, wherein said impedance matching unit includes:
   a first impedance matching inductor having a first terminal to be coupled to the input signal source for receiving the input voltage signal therefrom, and a second terminal coupled to said gate terminal of said injection transistor;
   a second impedance matching inductor having a first terminal coupled to said second terminal of said first impedance matching inductor, and a second terminal; and
   an impedance matching capacitor to couple said second terminal of said second impedance matching inductor to ground.

5. The injection locked frequency divider of claim 1, wherein said oscillating circuit includes:
   a first oscillating inductor having a first terminal to be coupled to a power source, and a second terminal coupled to said signal injection circuit;
   a second oscillating inductor having a first terminal coupled to said second terminal of said first oscillating inductor, and a second terminal;
   a third oscillating inductor having a first terminal coupled to said first terminal of said first oscillating inductor, and a second terminal coupled to said signal injection circuit and cooperating with said second terminal of said first oscillating inductor to receive the first differential signal pair therefrom;
a fourth oscillating inductor having a first terminal coupled to said second terminal of said third oscillating inductor, and a second terminal cooperating with said second terminal of said second oscillating inductor to output the second differential signal pair;
a fifth oscillating inductor having a first terminal coupled to said second terminal of said second oscillating inductor, and a second terminal;
a sixth oscillating inductor having a first terminal coupled to said second terminal of said fourth oscillating inductor, and a second terminal; and
a negative resistance compensation unit coupled to said second terminals of said fifth and sixth oscillating inductors, and configured to have an equivalent negative resistance.

6. The injection locked frequency divider of claim 5, wherein said negative resistance compensation unit includes:
a first transistor having a first terminal coupled to said second terminal of said fifth oscillating inductor, a grounded second terminal, and a control terminal coupled to said second terminal of said sixth oscillating inductor; and
a second transistor having a first terminal coupled to said second terminal of said sixth oscillating inductor, a grounded second terminal, and a control terminal coupled to said second terminal of said fifth oscillating inductor.

7. The injection locked frequency divider of claim 1, further comprising a buffer circuit coupled to said oscillating circuit for receiving the second differential signal pair therefrom, and configured to perform buffering on the second differential signal pair to generate a differential output signal pair.

8. The injection locked frequency divider of claim 7, wherein the second differential signal pair includes a pair of oscillating signals that are complementary to each other, the differential output signal pair includes a pair of output signals that are complementary to each other, said buffer circuit includes two buffer units, and at least one of said buffer units includes:
a first buffering inductor having a first terminal disposed to be coupled to a power source, and a second terminal;
a first buffering transistor having a first terminal coupled to said second terminal of said first buffering inductor, a grounded second terminal, and a control terminal coupled to said oscillating circuit;
a second buffering inductor having a first terminal coupled to said first terminal of said first buffering inductor, and a second terminal;
a second buffering transistor having a first terminal coupled to said second terminal of said second buffering inductor, a grounded second terminal, and a control terminal;
a third buffering inductor coupled between said first terminal of said first buffering transistor and said control terminal of said second buffering transistor; and
a capacitor having a first terminal coupled to said first terminal of said second buffering transistor, and a second terminal;
wherein said control terminal of said first buffering transistor of said at least one of said buffer units receives a corresponding one of the oscillating signals of the second differential signal pair from said oscillating circuit, and said second terminal of said capacitor of said at least one of said buffer units outputs a corresponding one of the output signals of the differential output signal pair.

* * * * *